United States Patent
Chanemougame et al.

(10) Patent No.: US 10,510,620 B1
(45) Date of Patent: Dec. 17, 2019

(54) WORK FUNCTION METAL PATTERNING FOR N-P SPACE BETWEEN ACTIVE NANOSTRUCTURES

(71) Applicant: GLOBALFOUNDRIES INC., Grand Cayman (KY)

(72) Inventors: Daniel Chanemougame, Niskayuna, NY (US); Steven R. Soss, Cornwall, NY (US); Steven J. Bentley, Menands, NY (US); Julien Frougier, Albany, NY (US); Ruilong Xie, Schenectady, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 16/047,043

(22) Filed: Jul. 27, 2018

(51) Int. Cl.
*H01L 21/8238* (2006.01)
*H01L 29/423* (2006.01)
(Continued)

(52) U.S. Cl.
CPC .......... *H01L 21/823842* (2013.01); *H01L 21/32133* (2013.01); *H01L 21/32139* (2013.01);
(Continued)

(58) Field of Classification Search
CPC ....... H01L 21/823842; H01L 21/32133; H01L 21/32139; H01L 21/76224; H01L 21/823807; H01L 21/823814; H01L 21/823821; H01L 21/823864; H01L 21/823878; H01L 29/0673; H01L 29/42392; H01L 29/6653; H01L 29/66545; H01L 27/0924; H01L 27/1104
See application file for complete search history.

(56) References Cited

U.S. PATENT DOCUMENTS 6,017,496 A 1/2000 Nova et al.
6,100,026 A 8/2000 Nova et al.
(Continued)

FOREIGN PATENT DOCUMENTS

GB 2510716 A 8/2014

OTHER PUBLICATIONS

U.S. Appl. No. 16/047,044, Response to Ex Parte Quayle Action dated Sep. 20, 2019, 6 pages.

*Primary Examiner* — Yosef Gebreyesus
(74) *Attorney, Agent, or Firm* — Anthony Canale; Hoffman Warnick LLC

(57) ABSTRACT

A method includes forming an isolation pillar between first and second active nanostructures for adjacent FETs. A first WFM for one FET is deposited over the first active nanostructure, the pillar and the second active nanostructure. The first WFM is removed from a part of the pillar. The removing creates a discontinuity in the first WFM over the first active nano structure from the first WFM over the second active nanostructure but leaves the first WFM on sidewalls of the pillar. When the first WFM surrounding the second active nanostructure is removed, the pillar and the discontinuity in the first metal on the part of the pillar prevent the etching from reaching and removing the first WFM on the first active nanostructure. Depositing a second WFM surrounding the second active nanostructure and the isolation pillar forms part of the gate for the second FET and couples the FETs together.

6 Claims, 10 Drawing Sheets

(51) Int. Cl.
  *H01L 29/06* (2006.01)
  *H01L 21/762* (2006.01)
  *H01L 21/3213* (2006.01)
  *H01L 29/66* (2006.01)
  *H01L 27/092* (2006.01)
  *H01L 27/11* (2006.01)

(52) U.S. Cl.
  CPC ............ *H01L 21/76224* (2013.01); *H01L 21/823807* (2013.01); *H01L 21/823814* (2013.01); *H01L 21/823821* (2013.01); *H01L 21/823864* (2013.01); *H01L 21/823878* (2013.01); *H01L 27/0924* (2013.01); *H01L 29/0673* (2013.01); *H01L 29/42392* (2013.01); *H01L 29/6653* (2013.01); *H01L 29/66545* (2013.01); *H01L 27/1104* (2013.01)

(56) References Cited

U.S. PATENT DOCUMENTS

| | | |
|---|---|---|
| 6,284,459 B1 | 9/2001 | Nova et al. |
| 6,319,668 B1 | 11/2001 | Nova et al. |
| 9,653,289 B1 * | 5/2017 | Balakrishnan ........ H01L 27/088 |
| 2016/0233298 A1 * | 8/2016 | Webb .................... H01L 23/535 |
| 2018/0342427 A1 * | 11/2018 | Xie ................. H01L 21/823878 |

* cited by examiner

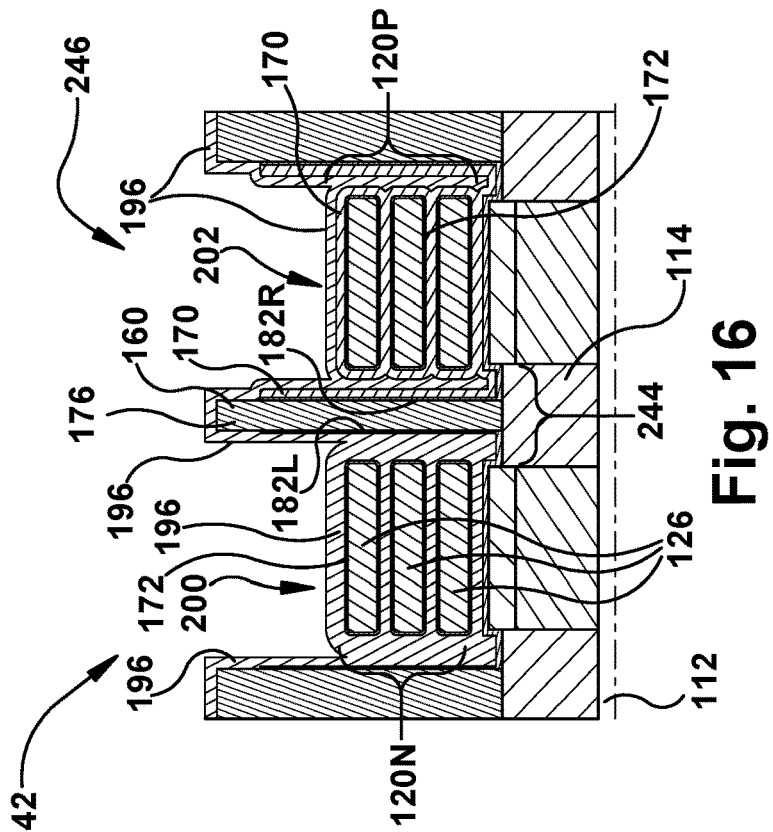
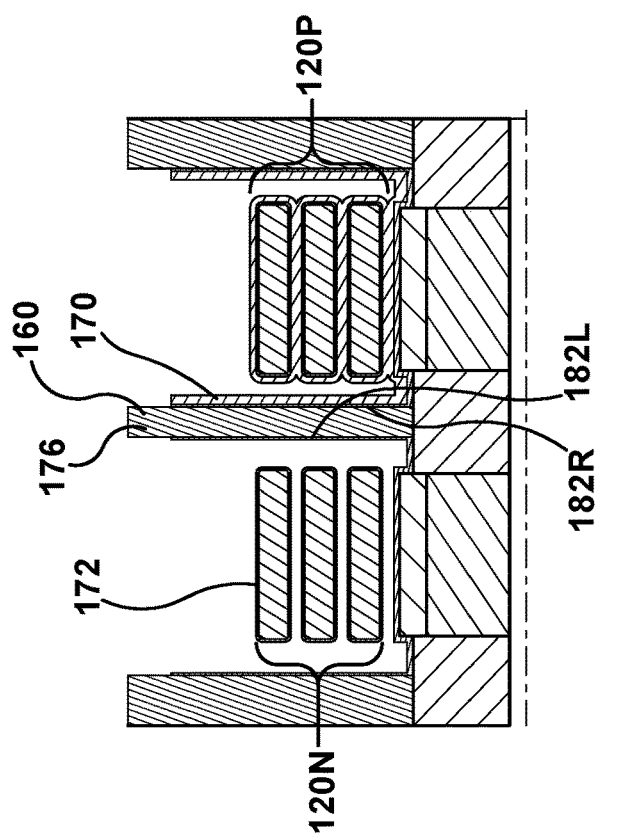

WORK FUNCTION METAL PATTERNING FOR N-P SPACE BETWEEN ACTIVE NANOSTRUCTURES

This application is related to U.S. application Ser. No. 16/047,044, entitled WORK FUNCTION METAL PATTERNING FOR N-P SPACES BETWEEN ACTIVE NANOSTRUCTURES USING UNITARY ISOLATION PILLAR, filed concurrently, and currently pending.

BACKGROUND

Technical Field

The present disclosure relates to integrated circuits, and more particularly to patterning work function metals for active nanostructure transistor devices with relatively small spaces between field effect transistors.

Related Art

Field-effect transistors (FET) include doped source/drain regions that are formed in a semiconductor and separated by a channel region. A gate insulation layer is positioned about the channel region and a conductive gate electrode is positioned over or about the gate insulation layer. The gate insulation layer and the gate electrode together may be referred to as the gate stack for the device. By applying an appropriate voltage to the gate electrode, the channel region becomes conductive and current is allowed to flow from the source region to the drain region.

To improve the operating speed of the FETs, and to increase the density of FETs on an integrated circuit (IC), designs have gradually become smaller in size. Reductions to the size and the channel length in FETs can improve the switching speed of the FETs. A number of challenges arise as feature sizes of FETs and ICs get smaller. For example, significant downsizing of traditional FETs may produce electrostatic issues and mobility degradation. Scaled-down FETs may have shorter gate lengths that make it more difficult to control the channel. New device architectures such as "gate-all-around" active nanostructures allow further scaling of ICs, in part, because the gate is structured to wrap around the channel, creating more surface area and better control. This structure can provide better control with lower leakage current, faster operations, and lower output resistance. Active nanostructures used to form the channel can include a semiconductor nanowire, i.e., a vertically or horizontally oriented thin wire, or a plurality of stacked nanosheets, i.e., a plurality of vertically spaced semiconductor sheets.

In very small transistors such as nanostructure FETs, metal gates are used to provide high performance. The threshold voltage of a FET is the minimum voltage required to create the conducting path between the source and drain. Metal gates include a gate metal with a work function metal (WFM) and a layer having a high dielectric constant (high-k) in a combination known as high-k metal gate (HKMG). The work function metal is typically located between the high-k layer and the metal gate, and is used to tune the threshold voltage of the transistor. The work function is the minimum energy (usually measured in electron volts) needed to remove an electron from a solid to a point immediately outside the solid surface (or energy needed to move an electron from the Fermi energy level into vacuum), i.e., the final electron position is far from the surface on the atomic scale but still close to the solid on the macroscopic scale. Different transistors may require different threshold voltages, and therefore different work function metals. For example, a PFET (a FET with a channel that contains holes) may require a different work function metal than an NFET (a FET with a channel that contains electrons).

Some integrated circuits, known as bimetallic integrated circuits, include both NFETs and PFETs. These bimetallic integrated circuits may require at least two different work function metals, one for PFETs and one for NFETs. In some cases, an integrated circuit design may include a PFET directly adjacent to an NFET. In such a scenario, it may be difficult to deposit and pattern the different work function metals completely around the active nanostructure of the adjacent FETs without causing other problems.

SUMMARY

A first aspect of the disclosure provides a method comprising: forming a first active nanostructure on a substrate and a second active nanostructure on the substrate, the first and the second active nanostructures being adjacent to each other and separated by a space; forming an isolation pillar between the first and second active nanostructures in the space; depositing a high dielectric constant (high-K) layer and a first metal over the first active nanostructure, the isolation pillar and the second active nanostructure; removing the first metal from a part of the isolation pillar, creating a discontinuity in the first metal separating the first metal over the first active nanostructure from the first metal over the second active nanostructure; etching to remove the first metal surrounding the second active nanostructure, wherein the isolation pillar and the discontinuity in the first metal on the part of the isolation pillar prevent the etching from reaching and removing the first metal on the first active nanostructure; and depositing the second metal surrounding the second active nanostructure.

A second aspect includes a method comprising: forming a first active nanostructure on a substrate and a second active nanostructure on the substrate, the first and the second active nanostructures being adjacent to each other and separated by a space; forming a spacer in between the first and second active nanostructure, a portion of the space remaining thereafter; forming a pillar material in the portion of the space; forming a dummy gate over the first and second active nanostructures; removing the dummy gate and the spacer, creating an isolation pillar from the pillar material in at least the space between the first and second active nanostructures; depositing a high dielectric constant (high-K) layer and a first work function metal (WFM) over the first active nanostructure, the isolation pillar and the second active nanostructure such that the high-K layer and the first metal surround the first active nanostructure and the high-K layer and the first metal surround the second active nanostructure; etching at least the first metal from a part of the isolation pillar, creating a discontinuity in the first metal separating at least the first metal over the first active nanostructure from the first metal over the second active nanostructure; forming a mask over the first active nanostructure including the high-K layer and the first metal, and over at least a part of the isolation pillar; etching to remove the first metal surrounding the second active nanostructure with an etching process, wherein the isolation pillar and the discontinuity in the first metal on the part of the isolation pillar prevent the etching process from reaching the first metal on the first active nanostructure and thereby preventing removal of the first metal on the first active nanostructure; removing the mask; and depositing a second metal surrounding each of the first and second active nanostructures and the isolation pillar.

A third aspect includes a field effect transistor (FET) structure, comprising: a first type field effect transistor having: a first active nanostructure on a substrate, a gate having a high dielectric constant (high-K) layer and a first work function metal (WFM) surrounding the first active nanostructure, and a source/drain (S/D) region at each of opposing ends of the first active nanostructure; a second type field effect transistor having: a second active nanostructure on the substrate adjacent to the first active nanostructure and separated by a space, the second FET further including a gate having the first WFM and a second work function metal (WFM) surrounding the second active nanostructure, and a source/drain (S/D) region at each of opposing ends of the second active nanostructure, the second WFM being different than the first WFM; and an isolation pillar positioned between the first and second active nanostructures in the space, wherein one of the first and second WFMs extends along a sidewall of the isolation pillar but not over an part of the isolation pillar.

BRIEF DESCRIPTION OF THE DRAWINGS

The embodiments of this disclosure will be described in detail, with reference to the following figures, wherein like designations denote like elements, and wherein:

FIG. 15 shows a cross-sectional view of removal of the mask for removing the first WFM, according to embodiments of the disclosure.

FIG. 16 shows a cross-sectional view of formation of a second WFM and a gate metal layer, according to embodiments of the disclosure. FIG. 16 also shows one embodiment of a FET structure according to embodiments of the disclosure.

FIG. 17 also shows another embodiment of a FET structure according to embodiments of the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
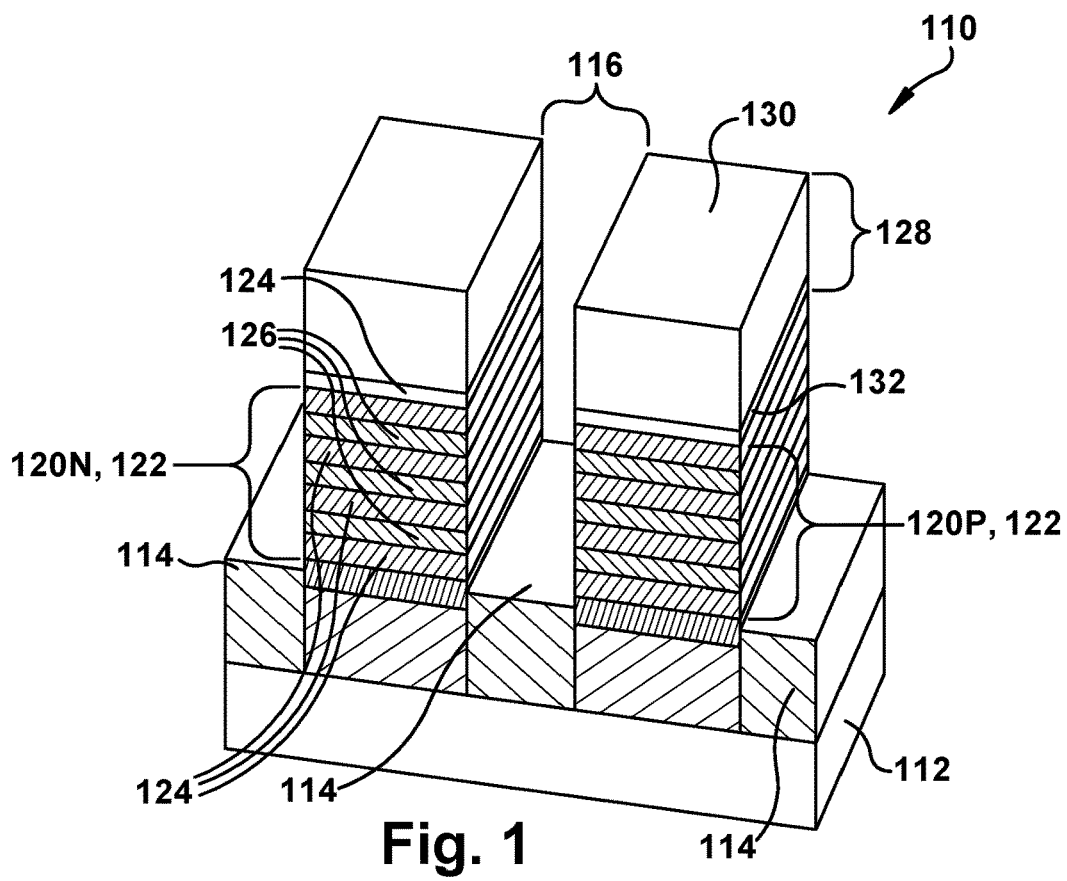
FIG. 1 shows a perspective cross-sectional view of active nanostructure formation, according to embodiments of the disclosure.

Embodiments of the present disclosure provide methods for work function metal (WFM) patterning for active nanostructure transistor devices that may be used in integrated circuits (IC). In some embodiments, an isolation pillar can reduce or eliminate an overetch formed during removal of a WFM such that the overetch does not expose the WFM on the adjacent active nanostructure. The resulting IC may include different WFMs on adjacent active nanostructures, creating different types of FETS. The isolation pillar may also find advantage relative to forming gate cut isolations between adjacent FETs.

It will also be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

As noted, bimetallic ICs include both NFETs and PFETs. These bimetallic ICs may use at least two different WFMs, one for PFETs and one for NFETs. In cases where an IC includes a PFET directly adjacent to an NFET, it may be difficult to deposit and pattern the different WFMs completely around the active nanostructure of the adjacent FETs without causing other problems. For example, within an opening created by removal of a dummy gate, a first WFM is applied to both FETs. However, the first WFM must be removed from the active nanostructure that requires a second, different WFM. Conventionally, a mask is formed in the dummy gate opening over a first active nanostructure, but not over an exposed second active nanostructure from which the first WFM must be removed. Isotropic wet etching is used to remove the first WFM from between the active nanostructure, e.g., nanosheets, fin or nanowire, of the exposed second active nanostructure that requires the second WFM. However, due to the small amount of space between the active nanostructures, the wet etching will follow the layer of the first WFM to the masked first active nanostructure. In particular, the wet etching may create a path to, or at least toward, the adjacent masked first active nanostructure, i.e., the etching overetches or sneaks around the mask. The overetch path may include an undercut under the mask layer, and/or a vertically extending path about the mask layer where ends thereof meet the first WFM in the dummy gate opening.

Conventionally, the spacing between adjacent nanostructures is sufficient to prevent the overetching from reaching the masked, first active nanostructure, and posing a problem. However, as the distance between adjacent nanostructures has decreased (e.g., to less than 45 nanometers (nm) not including work function metal layer thickness), it has been discovered that the overetching may extend far enough to expose the first WFM of the masked, first active nanostructure. In some cases, the overetching can remove or damage the first WFM about the masked, first active nanostructure (removing it from at least a side portion of the nanowire, fin or nanosheets thereof, and/or even from between nanosheets, where provided). In any event, the overetching may render the device inoperable.

The necessary duration of the wet etching can also impact the extent of overetching. For example, the overetching issue may be magnified relative to nanosheet stack applications because the wet etch must be allowed to act for a sufficient amount of time to remove the first WFM from not just around the active nanostructure, but also between the nanosheets of the exposed, second active nanostructure. The wet etch duration being longer in this setting, compared to a nanowire application, allows more time for the wet etch to work around the mask to remove the first WFM from the masked, first active nanostructure. In some cases, the duration may be sufficient for the wet etch to remove the first WFM from the first nanosheet stack even though it is covered by the mask. In another example, the width of nanostructures within a single IC may vary over a large scale for different devices. For example, a device for a static random access memory (SRAM) may have a nanostructure having a width of about 5 to 40 nm, but those for logic devices on the same IC may have a width of about 20 to 80 nm. The wet etch must have a duration to address the highest width active nanostructure (e.g., 80 nm) even though devices having a smaller width nanostructure that do not require such a long duration, are present. Consequently, the smaller width nanostructure devices are highly likely to experience overetching. As will be described, embodiments of the disclosure employ an isolation pillar to prevent the overetch from reaching the masked active nanostructure.

Another challenge with WFM patterning is addressing mask edge placement error (EPE). More particularly, the edge of the mask for WFM patterning is ideally placed between the adjacent active nanostructures, leaving the first WFM over the masked, first active nanostructure after the etching. Conventionally, such mask edge placement is not an issue because the space provides sufficient tolerance to statistically accommodate some misalignment. However, as the distance between adjacent active nanostructures is decreased, the ability to properly place an edge of the mask between adjacent nanosheet stacks, fins or nanowires is significantly impaired. For example, for the next generation of devices (e.g., 7 nm), the space between active nanostructures is at or less than 45 nm, considering the high-K layer and the first WFM on both active nanostructures, the space left to land the mask edge becomes too small to reliably ensure the mask edge lands properly. Due to current mask edge alignment variations, the mask edge can be either on top of or too close to one or the other nanostructure, i.e., nanosheet stack, fin or nanowire. If the mask edge is on top of the first active nanostructure, the wet etch may remove at least part of the first WFM from an unmasked portion of the first active nanostructure, rendering the first device inoperable. If the mask edge is on top of the second active nanostructure, the wet etch cannot properly remove the first WFM from the second active nanostructure, possibly rendering the second device inoperable. If the mask is too close to either nanostructure, it increases the likelihood of mask undercut, and its resulting structural issues. As will be described, the isolation pillar according to embodiments of the disclosure addresses this challenge by relaxing the precision required to land the mask edge.

Referring to the drawings, a method according to embodiments of the disclosure will be described. FIG. 1 shows a perspective cross-sectional view of a precursor structure 110. Precursor structure 110 may include a substrate 112 which may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire semiconductor substrate may be strained. Substrate 112 may also take the form of a semiconductor-on-insulator (SOI) substrate, including an SOI layer over a buried insulator layer (not shown) over a bulk semiconductor layer. The buried insulator layer may include, for example, silicon oxide, and the semiconductor layers may include any semiconductor material listed herein.

FIG. 1 also shows a plurality of shallow trench isolations (STIs) 114 separating active nanostructures 120N and 120P. Each STI 114 may include a trench etched into substrate 112 filled with an insulator, or an insulator deposited on top of substrate 112. STIs 114 isolate one region of the substrate from an adjacent region of the substrate. As understood, one or more transistors of a given polarity may be disposed within an area isolated by STI 114. Each STI 114 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

FIG. 1 also shows forming a first active nanostructure 120P on substrate 112 and a second active nanostructure 120N on substrate 112. This step may occur before or after STI 114 formation. Active nanostructures 120N, 120P may be formed using any now known or later developed lithography process. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example. Here, the nanostructures are etched to form their final shape. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

"Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

After forming, first and the second active nanostructures 120P, 120N are adjacent to each other and separated by a space 116. Space 116 may be less than 45 nanometers (nm). As used herein, "active nanostructure" may include any form of vertically oriented semiconductor structure for providing a channel of a transistor device, e.g., one capable of a gate all around arrangement. As illustrated, active nanostructures 120N, 120P may include nanosheet stacks 122. Here, forming first and second active nanostructures 120P, 120N may include forming respective first and second nanosheet stacks 122. Each nanosheet stack 122 may include nanosheets 126 separated (alternatingly) by sacrificial layers 124. Nanosheets 126 may include a semiconductor, e.g., silicon, and sacrificial layers 124 may include any of a variety of sacrificial materials, such as silicon germanium. Other materials for nanosheets and/or sacrificial layers are possible. Nanosheet stacks 122 may include at least one nanosheet 126. In one embodiment, each nanosheet stack 122 includes four nanosheets 126. Nanosheet stacks 122 may be formed by alternating deposition of sacrificial layers 124 and nanosheet 126 layers, followed by photolithographic patterning using a mask 128 including a hard mask 130, e.g., of silicon nitride, and a pad oxide 132.

Continuing with FIG. 1, mask 128 may be shaped to form space 116 between active nanostructures 120N, 120P. Space 116 may have a different width between pairs of adjacent NFETs and PFETs, adjacent NFETs and/or adjacent PFETs. For example, the N-P spacing may be smaller than the others such that, as will be described, only one isolation pillar is formed in an N-P space, but two are formed in N-N or P-P space—one on each active nanostructure. Active nanostructures 120N, 120P may be etched to their shapes shown using any appropriate etching process. Once active nanostructures 120N, 120P are shaped, mask 128 may remain temporarily in place.

While active nanostructures 120N, 120P will be described herein as nanosheet stacks 122, it is understood that they can take a variety of alternative forms including but not limited to: semiconductor fins, semiconductor nanowires, etc. As will be apparent to those skilled in the art, the teachings of the disclosure are applicable to any variety of nanostructure.

Figure 2:
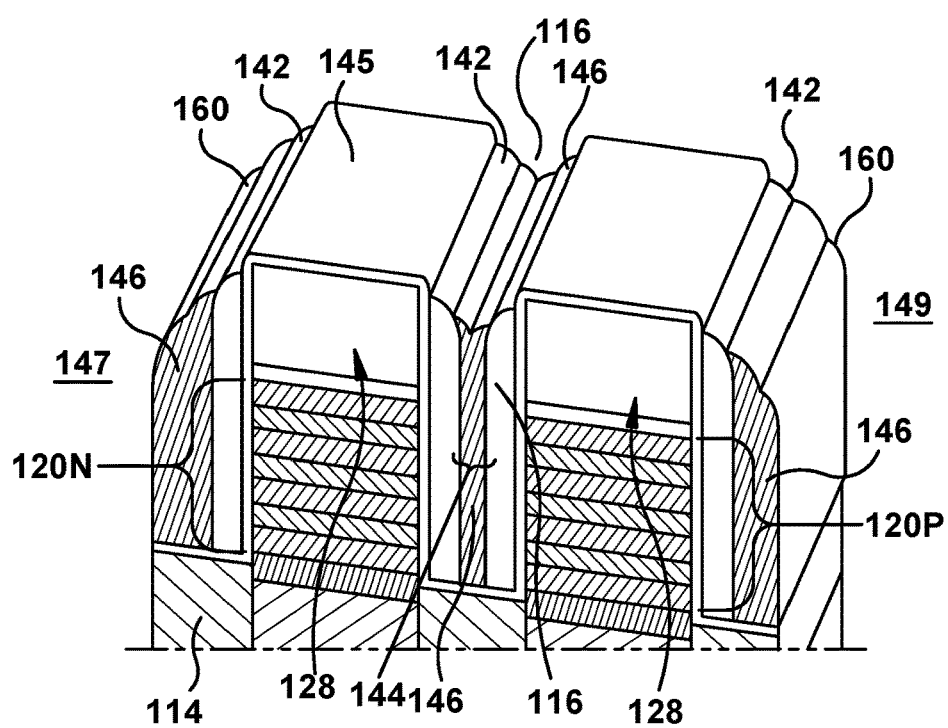
FIG. 2 shows a perspective cross-sectional view of a sacrificial layer and pillar material formation on active nanostructures, according to embodiments of the disclosure.

FIG. 2 shows a perspective cross-sectional view, and FIGS. 3-7 show cross-sectional views of a process of forming an isolation pillar 160 between first and second active nanostructures 120N, 120P in space 116. The teachings of the disclosure will be described relative to an isolation pillar 160 between first and second nanostructures 120N, 120P for an NFET and PFET, i.e., for N-P space, but one or more isolation pillars 160 may be formed in spaces between same types of FETS. That is, isolation pillar(s) 160 may be formed between all adjacent active nanostructures on the substrate, e.g., in N-N space 147 and P-P space 149 (adjacent active nanostructures removed for clarity). As shown in FIG. 2, the process may include forming a spacer 142 in between first and second active nanostructure 120P, 120N such that a portion 144 of space 116 remains open thereafter. This step may include depositing spacer 142 and then etching it back, e.g., with a RIE. Spacer 142 may include, for example, amorphous silicon. An oxide layer 145 is also shown deposited on mask 128, but may not be necessary in all instances.

FIG. 2 also shows forming a pillar material 146 in portion 144 of space 116. This process may include depositing pillar material 146, and then etching it back, e.g., with a RIE. Pillar material 146 may include but is not limited to: silicon oxycarbide (SiOC), silicon oxy-carbide nitride (SiOCN), silicon nitride (SiN) or silicon boron carbon nitride (SiBCN). Mask 128 may be taller than conventional processes to ensure isolation pillar 160 formed in space 116 at least starts out taller than active nanostructures 120N, 120P. That is, each isolation pillar 160 extends above an upper surface of each active nanostructure 120N, 120P, the purpose of which will be described herein. Note also, isolation pillar 160 is between active nanostructures 120N, 120P (in middle of drawing) but also extends around each nanosheet stack 122.

Figure 4:
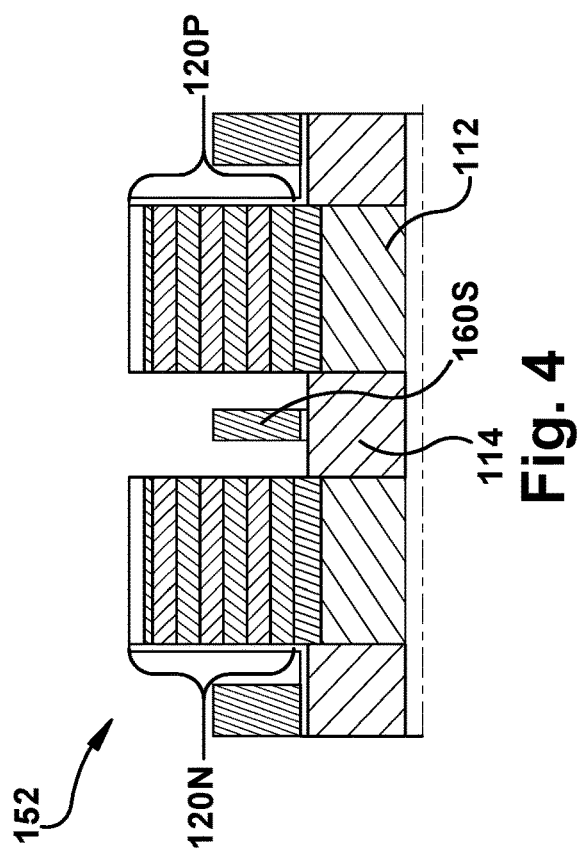
FIG. 4 shows a cross-sectional view of the partial or full removal of isolation pillar in a source/drain area, prior to source/drain region formation, according to embodiments of the disclosure.
Figure 3:
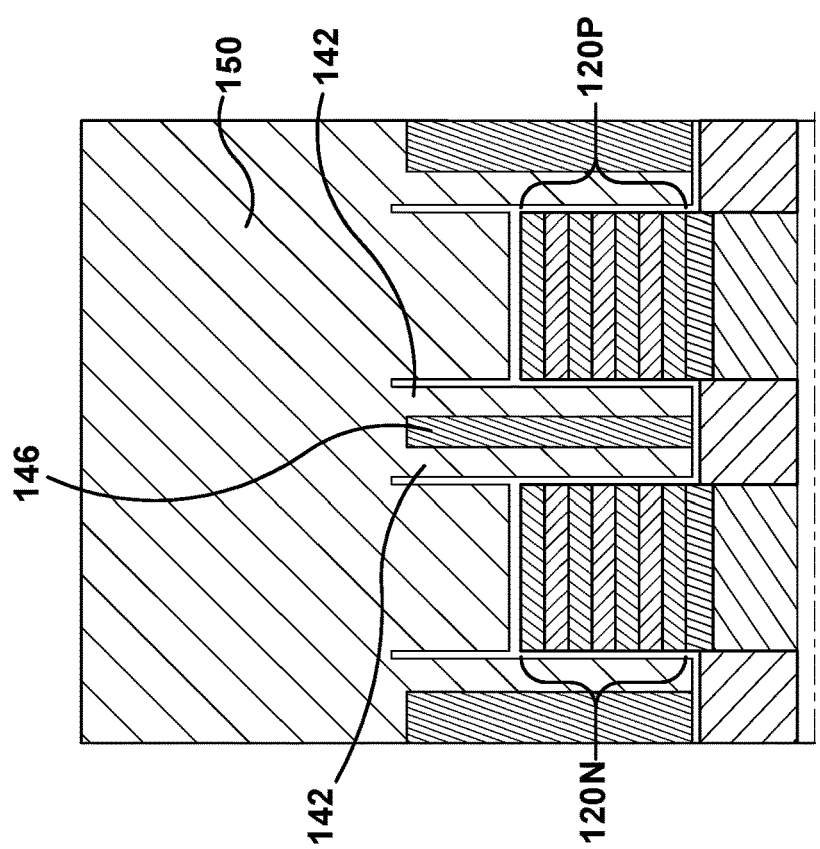
FIG. 3 shows a cross-sectional view of dummy gate formation across active nanostructures, according to embodiments of the disclosure.

FIGS. 3-4 show cross-sectional views of optionally forming a dummy gate 150 over first and second active nanostructures 120N, 120P. FIG. 3 shows a view through a gate area of active nanostructures 120N, 120P, and FIG. 4 shows a view through a source/drain (S/D) area 152 at end(s) of active nanostructures 120N, 120P.

Dummy gate 150 may be formed by depositing, for example, amorphous silicon, and then patterning the dummy gate by using any now known or later developed photolithographic process, e.g., forming a mask, patterning the mask and etching. This step may include or be preceded by removing mask 128 (FIG. 2), e.g., by an ashing process, such that dummy gate 150 material also fills the space previously filled by mask 128 (FIG. 2). As understood in the art, active nanostructures 120N, 120P act as a channel region for the FETs formed thereby (FIG. 3), and S/D regions are formed at each end of active nanostructures 120N, 120P. As shown in FIG. 4, as is conventional, patterning of dummy gate 150 exposes S/D area 152 so that, as shown in FIG. 5, S/D regions 154N and 154P may be formed at respective S/D region locations while dummy gate 150 protects other areas of the FET devices, e.g., active nanostructures 120N, 120P.

It is understood that active nanostructures 120N, 120P will generally be surrounded by an interlayer dielectric (ILD) later in the process sequence, after dummy gate 150 is formed. ILD 158 may include but is not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Figure 5:
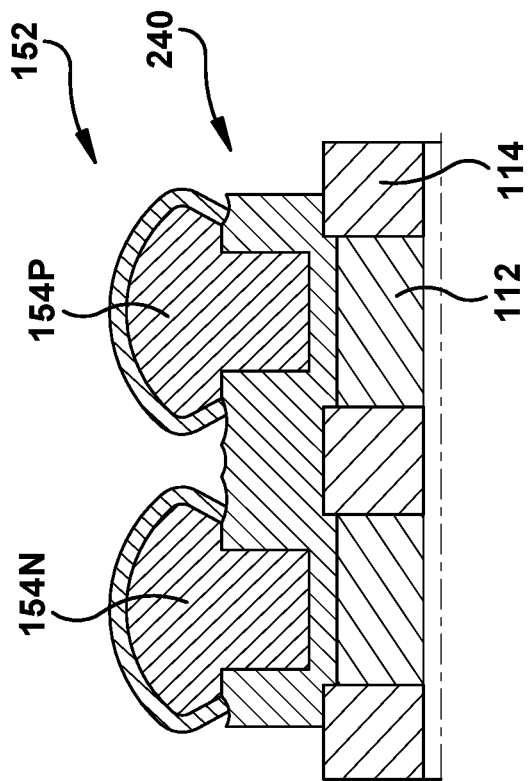
FIG. 5 shows a cross-sectional view of source/drain region formation in a source/drain area using a shortened isolation pillar, according to embodiments of the disclosure.
Figure 6:
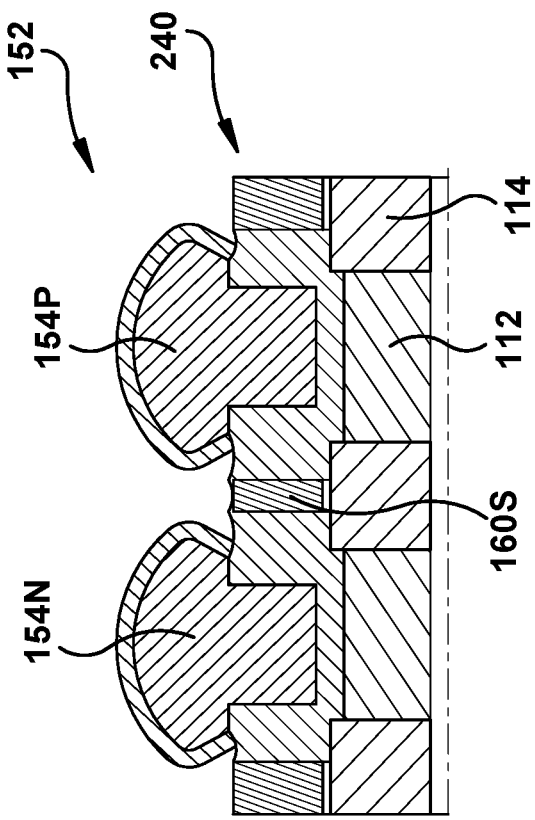
FIG. 6 shows a cross-sectional view of source/drain region formation in a source/drain area with no isolation pillar, according to embodiments of the disclosure.

FIGS. 5 and 6 show perspective cross-sectional views through S/D area 152, i.e., with active nanostructures 120N, 120P not visible because they are in another cross-sectional plane in the page of the drawings. The patterning of dummy gate 150 may be dictated by a mask (not shown) and the etching used. The dummy gate patterning process may also be used to reveal a portion of an isolation pillar 160S from pillar material 146 in space 116 (FIG. 2) in S/D area 152, i.e., eventually adjacent S/D regions 154 at respective S/D region locations at ends of each of first and second nanostructures 120N, 120P. Portion of isolation pillar 160S has a width and a height similar to another portion of pillar material 146, e.g., adjacent nanostructures 120N, 120P. Portion of isolation pillar 160S may have a height thereof adjusted during or after the patterning of dummy gate 150. In one embodiment, shown in FIG. 5, a portion of isolation pillar 160S may have a height reduced during or after the dummy gate patterning such that it extends partly upward but does not extend between S/D regions 154 after they are formed, i.e., so they may join together if so desired. Another portion of isolation pillar 160 between nanostructures 120N, 120P retains the full height. Alternatively, as shown in FIG. 6, the portion isolation pillar between S/D regions 154 may be removed entirely during or after the dummy gate patterning such that it is non-existent between S/D regions 154 after they are formed.

S/D regions 154, shown in FIGS. 5 and 6, may be formed using any now known or later developed process including, for example, epitaxial growth of doped semiconductor at respective S/D region locations, i.e., having exposed semiconductor material. An annealing process may be carried out to drive in dopants into semiconductor material (not labeled) underlying S/D regions 154. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. As understood, where dummy gate 150 is used, it protects other part of the structure, e.g., active nanostructures 120N, 120P, during formation of S/D regions 154 and other processes (not all relevant to current disclosure) that occur at about the same time, e.g., anneals and other processes damaging to active nanostructures.

FIGS. 7-17 show cross-sectional views through a gate area of active nanostructures 120N, 120P.

Figure 7:
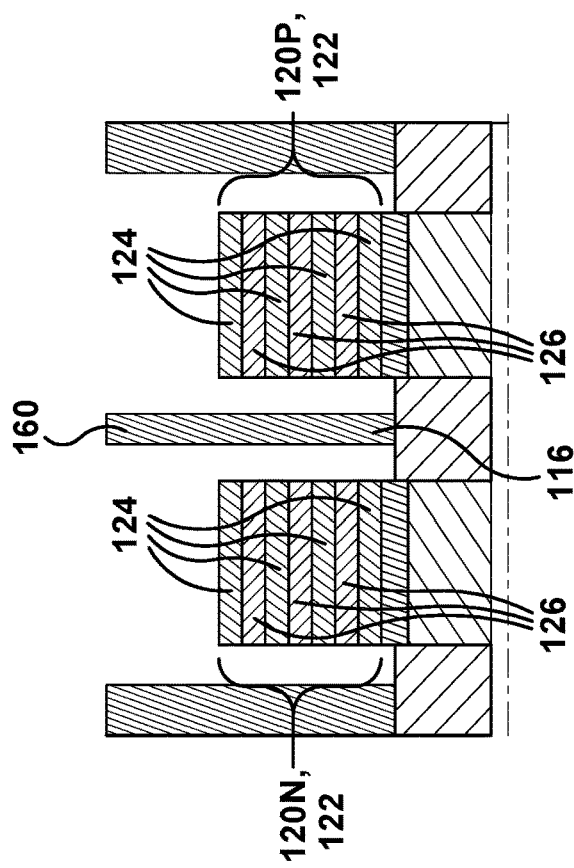
FIG. 7 shows a cross-sectional view of dummy gate removal and isolation pillar formation, according to embodiments of the disclosure.

FIG. 7 shows removing spacer 142 (FIG. 3), and creating isolation pillar 160 from pillar material 146 (FIG. 3) in space 116 between first and second active nanostructures 120N, 120P, e.g., in a gate region. This step may also include patterning dummy gate 150 (FIG. 4) (if provided), and removing a dummy gate oxide layer (not shown), if used. This process may include any now known or later developed etching process appropriate for spacer 142 (FIG. 3) and, where provided, dummy gate 150 (FIG. 3) material, e.g., a RIE for amorphous silicon. Due to the height of mask 128 (FIG. 2) in space 116 (FIG. 2), isolation pillar 160 extends above an upper surface of both active nanostructures 120N, 120P. Again, isolation pillar 160S (FIG. 5) which is present in S/D area 152 between adjacent S/D regions 154N, 154P is made shorter than isolation pillar 160 between first and second active nanostructures 120P, 120N (see FIG. 2) in the gate region. As shown in FIG. 6, isolation pillar 160S may also be removed in S/D area 152. It is noted that isolation pillar 160 was formed without the need of an additional mask.

Figure 8:
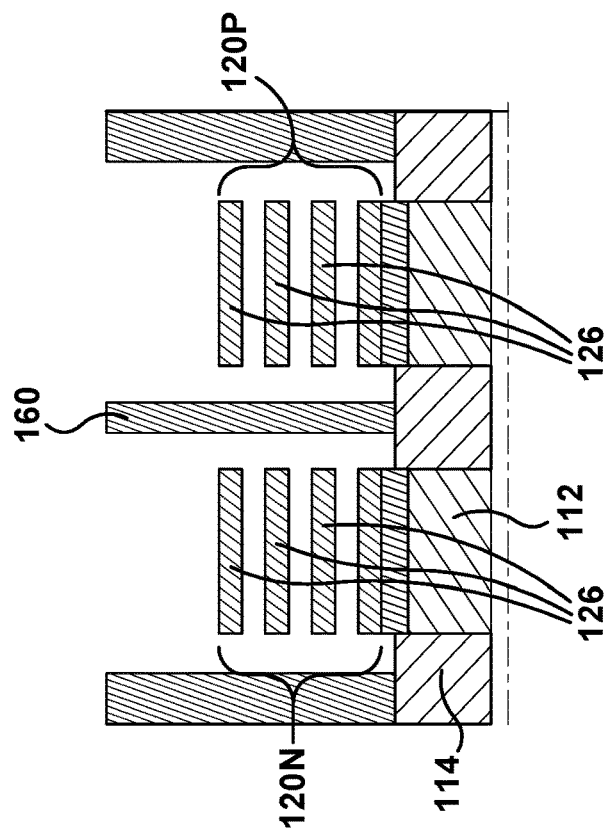
FIG. 8 shows a cross-sectional view of a nanosheet release process, according to one embodiment of the disclosure.

FIG. 8 shows, after removing spacer 142, removing sacrificial layers 124 (FIG. 7) from first and second nanosheet stacks 120. This process is sometimes referred to as "channel release" as it is forming the channel for the FETs. The process may include any now known or later developed etching process to remove sacrificial layers 124, e.g., of amorphous silicon, and selective to nanosheets 126. Any trimming process required to create the final size and shape of nanosheets 126 may be provided also at this stage. It is understood that where nanosheet stacks 122 are not employed, e.g., where fins or nanowires are used, this step may be skipped.

Figure 9:
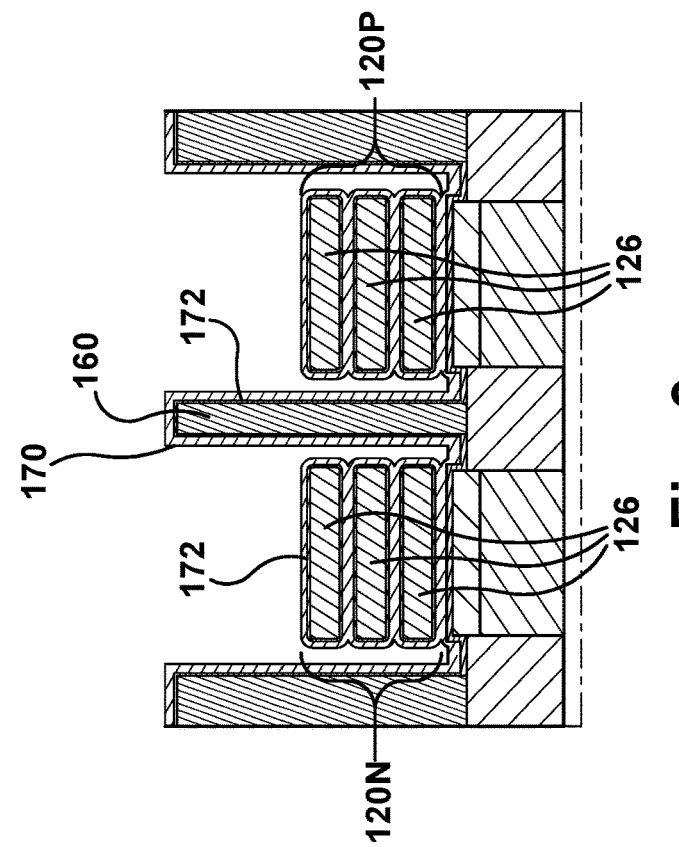
FIG. 9 shows a cross-sectional view of a high dielectric constant (high-K) layer and first work function metal (WFM) formation in a gate area, according to embodiments of the disclosure.

FIG. 9 shows a cross-sectional view of depositing a high dielectric constant (high-K) layer 172 and a first metal 170 over first active nanostructure 120P, isolation pillar 160 and second active nanostructure 120N. Note again, isolation pillar 160 is between active nanostructures 120N, 120P (in middle of drawing) but also at each end, i.e., isolation pillar 160 is formed around each nanosheet stack 122. High-K layer 172 acts as a gate dielectric for high-K metal gates (HKMG) of the FETs. High-K layer 172 is formed on substrate 112 and first and second active nanostructures 120P, 120N before the depositing of first metal 170. Examples of high-K material (having K higher than silicon oxide) include but are not limited to: metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$, where x, y, and z represent relative proportions, each greater than or equal to zero and x+y+z=1 (1 being the total relative mole quantity). As understood in the art, first metal 170 may include a work function metal (WFM) for a particular type of FET, i.e., n-type or p-type. That is, first metal 170 may include a PFET work function metal or an NFET work function metal, depending on what type of FET is being built from first active nanostructure 120P. In the example shown, active nanostructure 120P will eventually become a PFET, hence first metal 170 will be a PFET WFM such as but not limited to: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Where active nanostructures 120P, 120N include nanosheets 126, the depositing of first metal 170 includes depositing the first metal such that the first metal surrounds each of nanosheets 126 of first active nanostructure 120P, and such that the first metal surrounds each of nanosheets 126 of second active nanostructure 120N. The depositing steps may include, for example, CVD, ALD, PECVD, etc.

Figure 10:
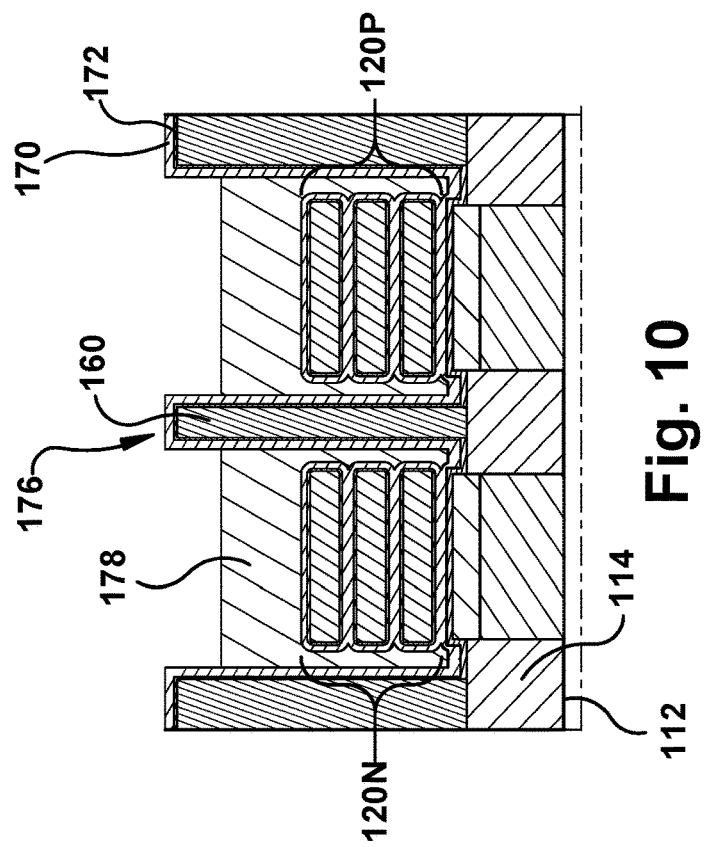
FIG. 10 shows a cross-sectional view of removing the first WFM to expose a part of the isolation pillar, according to embodiments of the disclosure.
Figure 12:
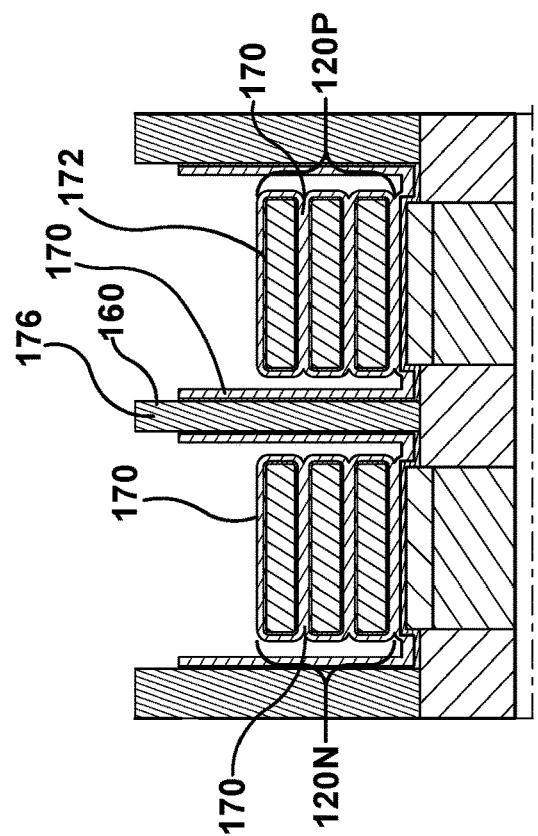
FIG. 12 shows a cross-sectional view of removal of the protective layer for removing the first WFM from the part of the isolation pillar, according to embodiments of the disclosure.
Figure 11:
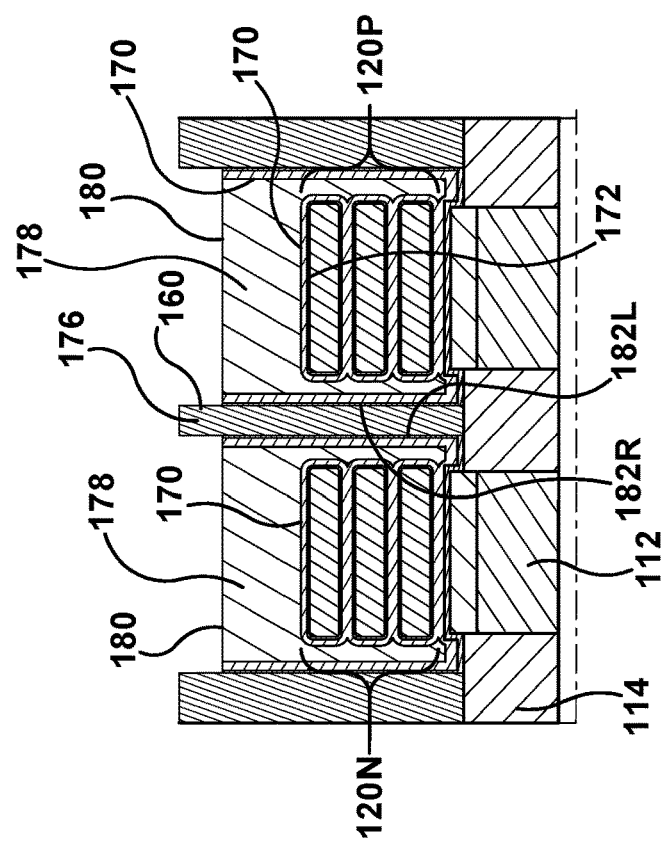
FIG. 11 shows a cross-sectional view of removal of the high-K layer and first WFM from the part of the isolation pillar, according to embodiments of the disclosure.

FIGS. 10 and 11 show cross-sectional views of removing first high-K layer 172 and first metal 170 from a part 176 of isolation pillar 160. This process may include covering the first and second active nanostructures 120N, 120P with a protective layer 178, e.g., a soft mask material like silicon oxide or an organic planarization layer (OPL), and etching back protective layer 178 such that upper surface 180 is between top of isolation pillar 160 and top of nanostructures 120N, 120P. Isolation pillar 160 has at least part of an upper end thereof sufficiently above upper surfaces of active nanostructures 120N, 120P as controlled by height of mask 128 (FIG. 1), to allow the removal of first metal 170 and high-K layer 172 from part 176 without removal from active nanostructures 120N, 120P. Part 176 may include any section of isolation pillar 160 that segregates or creates a discontinuity in first metal 170 and segregates or creates a discontinuity in first high-K layer 172, e.g., the part can be on an upper surface of isolation pillar 160, and/or on part of one or more sidewalls 182L, 182R of isolation pillar 160 (shown as both). Here, protective layer 178 covers active nanostructures 120N, 120P such that isolation pillar 160, where it is covered by high-K layer 172 and first metal 170, extends above an upper surface 180 of protective layer 178. As shown in FIG. 11, an etching may then be performed to remove at least first metal 170 from part 176 isolation pillar 160, and from a top part of the gate cavity, as recognized by one skilled in the art. The etching creates a discontinuity in first metal 170. Optionally, the etching may also remove part of high-K layer 172. This process is sometimes referred to as chamfering. The etching may include any appropriate etching process such as a RIE for high-K layer 172 (optionally) and first metal 170. As shown in FIG. 11, first metal 170 (and optionally high-K layer 172) includes a discontinuity therein that separates first metal 170 over first active nanostructure 120P from first metal 170 (and optionally high-K layer 172) over second active nanostructure 120N. However, high-K layer 172 and first metal 170 may remain on opposing sidewalls 182 of isolation pillar 160. Once completed, protective layer 178 may be removed, e.g., by an ashing process, as shown in FIG. 12.

Figure 13:
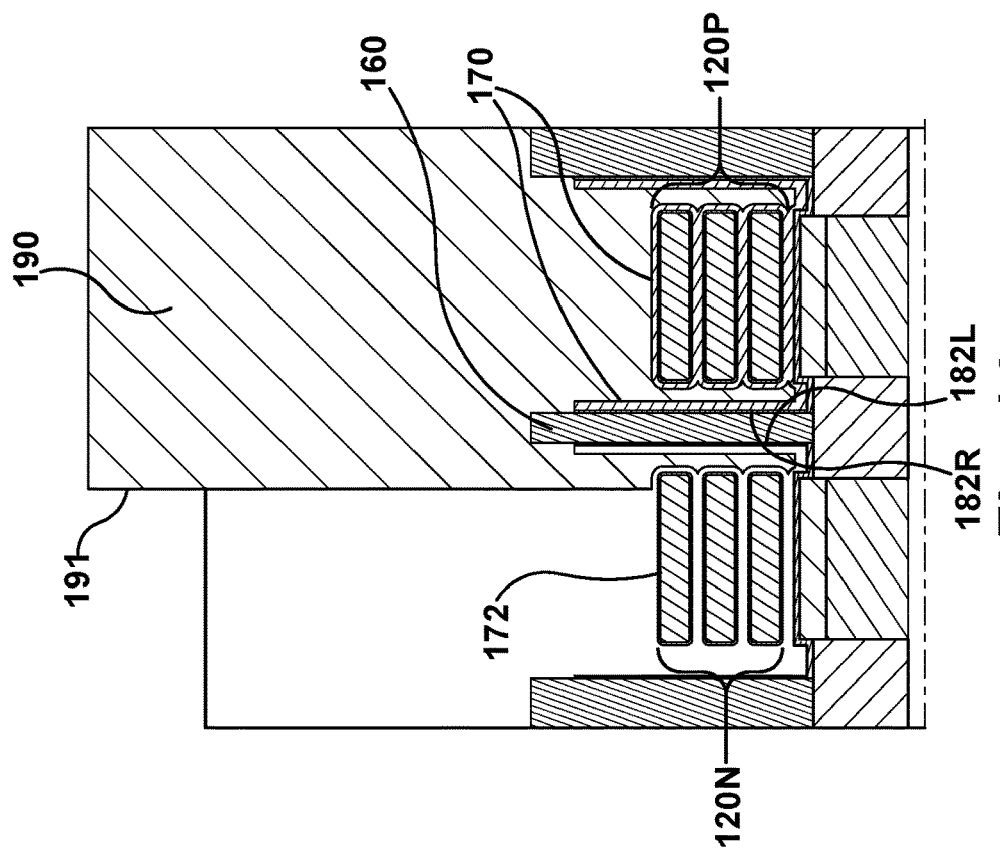
FIG. 13 shows a cross-sectional view prior to removing the first WFM from an active nanostructure, according to embodiments of the disclosure.
Figure 14:
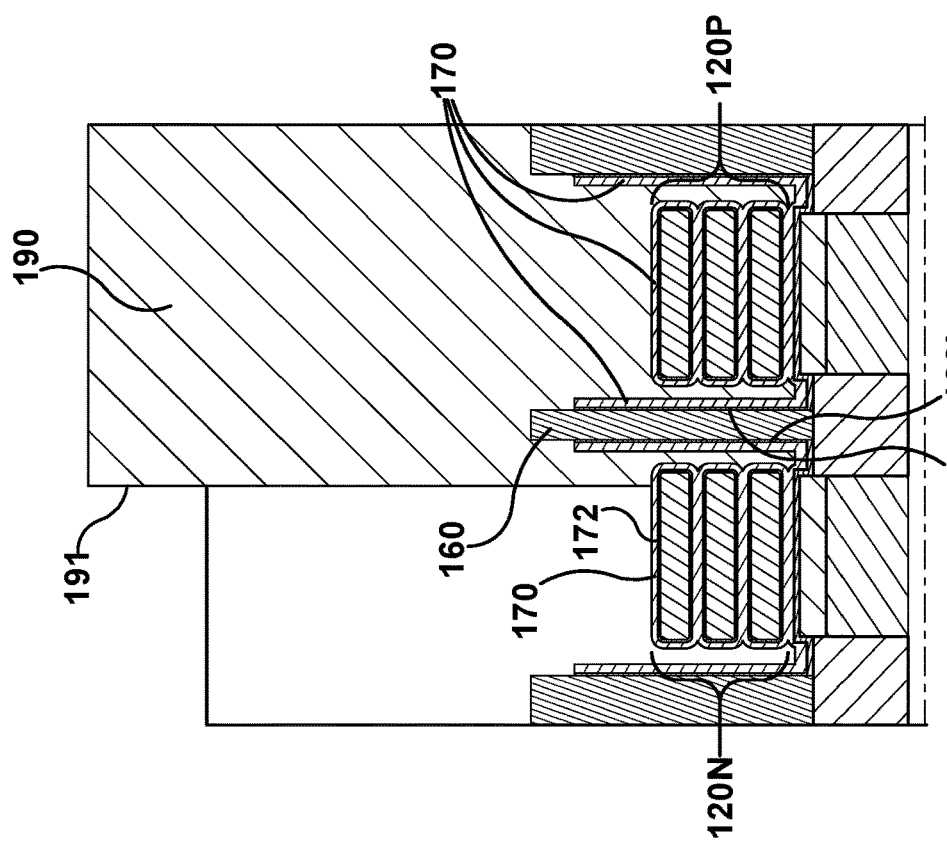
FIG. 14 shows a cross-sectional view of removing the first WFM from the active nanostructure, according to embodiments of the disclosure.

FIGS. 13 and 14 shows cross-sectional views of removing first metal 170 surrounding second active nanostructure 120N. Here, as shown in FIG. 13, a mask 190 may be positioned to cover first active nanostructure 120P and can land on or even cover isolation pillar 160. In contrast to conventional processes, an edge 191 of mask 190 can land in a less precise manner so long as first active nanostructure 120P is covered because isolation pillar 160 and discontinuity in first metal 170 on part 176 of isolation pillar 160 prevent (wet) etching from reaching and removing first metal 170 on first active nanostructure 120P. In particular, first metal 170 on a sidewall 182L (left side in example shown) of isolation pillar 160 provides a controlled, directed and limited path through which wet etching may attempt to reach first active nanostructure 120P along sidewall 182L. However, because first metal 170 is removed over part 176, the wet etching cannot reach first metal 170 on first active nanostructure 120P. Even if the wet etching extends to part 176 (e.g., at or near an upper end) of isolation pillar 160, mask 190 interaction with discontinuity in first metal 170 on part 176 of isolation pillar 160 prevents the wet etching from reaching first metal 170 over first active nano structure 120P. Consequently, as shown in FIG. 14, the wet etching can be aggressive and thorough. Further, the time required to remove first metal 170 from differently sized active nanostructures 120N on an IC is irrelevant because, regardless of the length of time to remove them from the widest of second active nanostructures 120N, all of the other first active nanostructures 120P are protected. The wet etching may include any appropriate etching process(es) to remove first metal 170, e.g., RIEs. As shown in FIG. 14, where nanosheets 126 are used, high-K layer 172 and first metal 170 is removed by etching from between nanosheets 126 of second active nanostructure 120N.

FIGS. 15 and 16 show cross-sectional views of depositing a second metal 196 surrounding second active nanostructure 120N. As also shown in FIG. 16, second metal 196 may be deposited over each of first nanostructure 120P and second active nanostructure 120P (and isolation pillar 160). FIG. 15 shows removal of mask 190 (FIG. 14), and FIG. 16 shows depositing of second metal 196, e.g., by CVD or other appropriate deposition technique. Second metal 196 includes the other of the PFET work function metal and the NFET work function metal. In this example, second metal 196 may include an NFET work function metal such as but not limited to: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. Where nanosheets 126 are employed, as shown in FIG. 16, second metal 196 may be deposited such that it surrounds each of nanosheets 126 of second active nanostructure 120N and, if desired, first active nanostructure 120N. With regard to first active nanostructure 120P, second metal 196 may fill any voids between first metal 170 on nanosheets 126 and first metal 170 on adjacent sidewall 182R of isolation pillar(s) 160, and it may also cover first metal 170. First active nanostructure 120P now forms part, i.e., channel within a gate, of a PFET 202, and second active nanostructure 120N now forms part, i.e., channel within gate, of an NFET 200. Where second metal 196 extends between isolation pillar 160 and active nanostructures 120N, 120P, it may electrically connect the P gate and the N gate together. Hence, an additional metal deposition and patterning may not be mandatory to reconnect N and P gates together, which is advantageous because, due to the small spacing, gate metal such as tungsten (W) or cobalt (Co), may not be able to fit in the space. This arrangement also advantageously may reduce gate end capacitance.

FIG. 16 also shows an optional embodiment in which a gate metal layer 204 is formed over second metal 196, i.e., to further electrically connect NFET 200 and PFET 202. Gate metal layer 204 may include any now known or later developed gate metal such as but not limited to tungsten (W) or cobalt (Co). Gate metal layer 204 may be formed using any appropriate deposition process for the metal, perhaps followed by a planarization step. As noted, even where gate metal layer 204 cannot or is not used, NFET 200 and PFET 202 are electrically connected by second metal 196.

Figure 17:
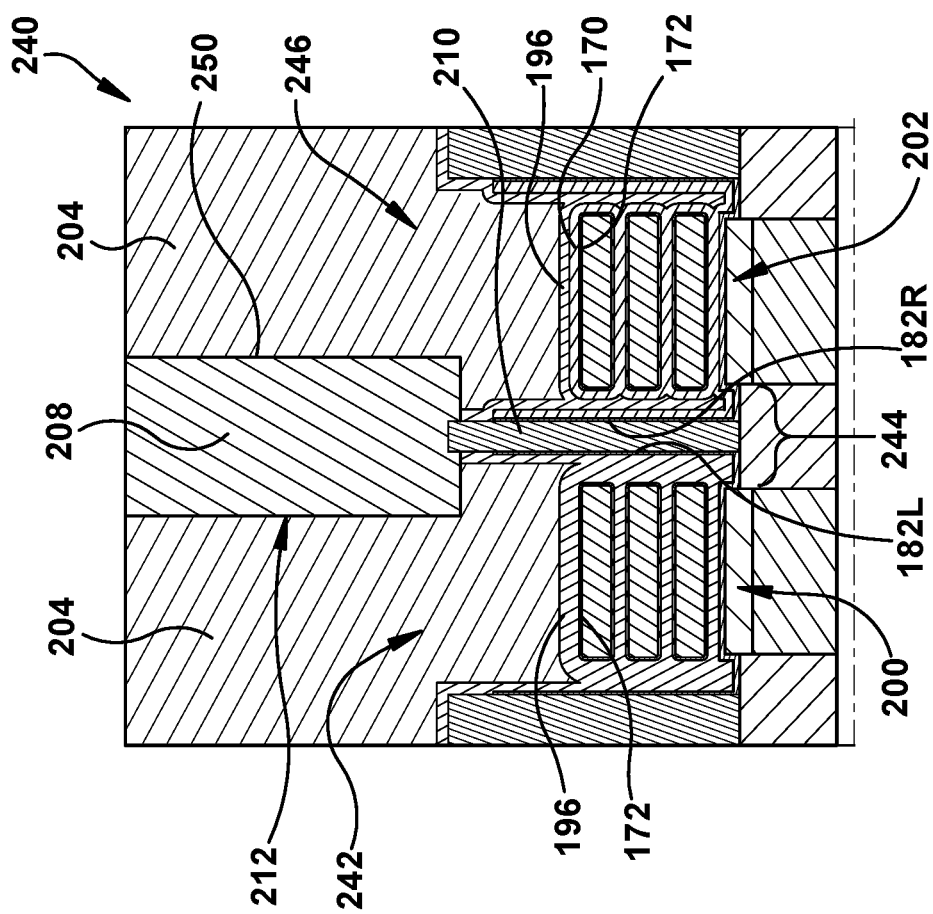
FIG. 17 shows a cross-sectional view of formation of a gate cut isolation using the isolation pillar, according to embodiments of the disclosure.
Figure 18:
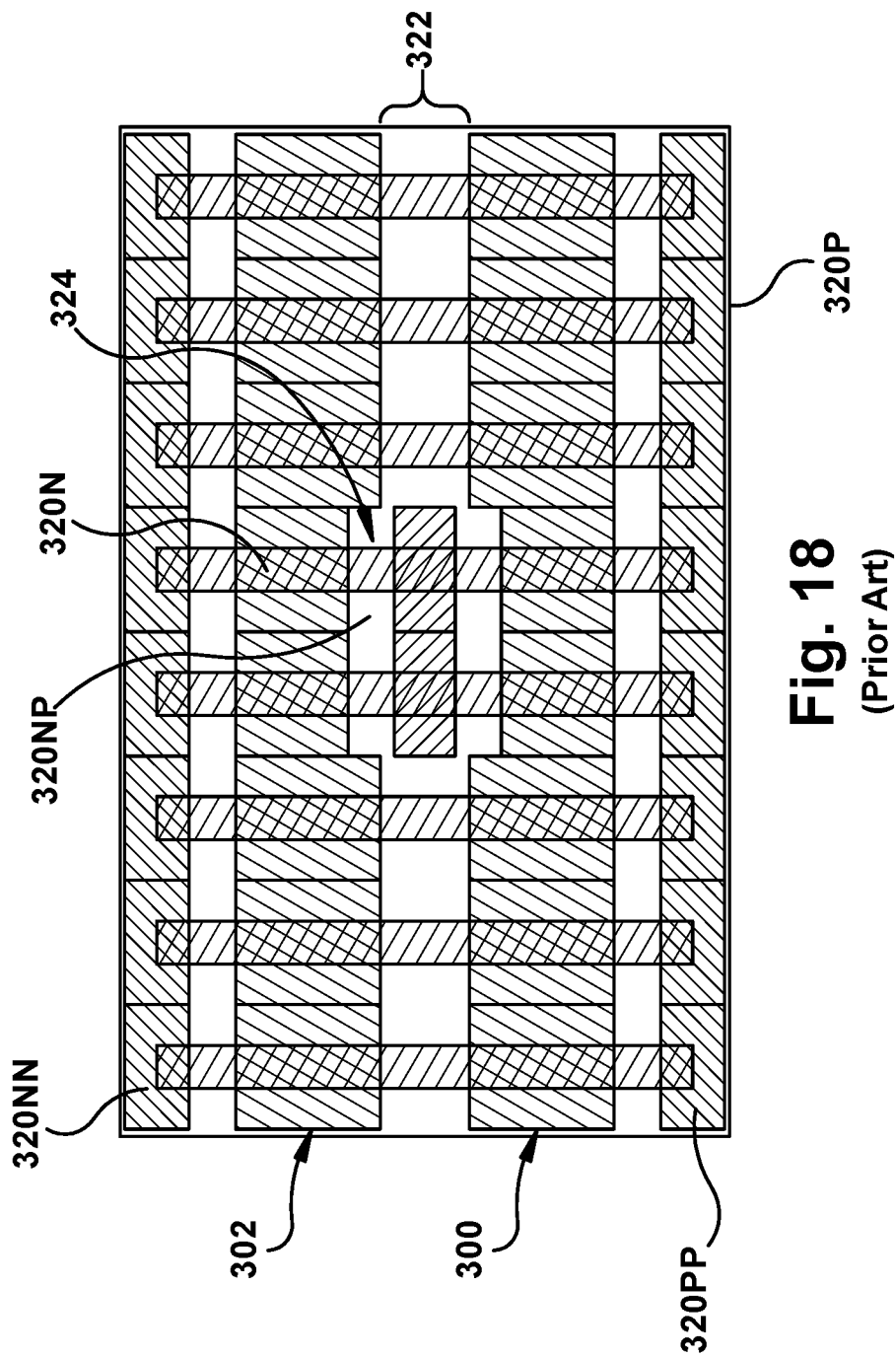
FIG. 18 shows a plan view of conventional formation of a gate cut isolation.

FIG. 17 shows a cross-sectional view of forming an isolation region 208 to an upper portion 210 of isolation pillar 160. For comparison purposes, FIG. 18 shows a plan view of a conventional design. As shown in FIG. 17, in accordance with embodiments of the disclosure, isolation region 208 and isolation pillar 160 create a gate cut isolation 212 between NFET 200 and PFET 202. Isolation pillar 160 and isolation region 208 are not unitary, i.e., although they may be the same material, they have an interface therebetween based on their separate formation processes. As understood by one skilled in the art, a conventional gate cut isolation is typically formed after forming dummy gate 150 (FIG. 3), e.g., by forming an opening in the dummy gate between active nanostructures to substrate 112, and filling the opening with an insulator that remains in place after dummy gate removal. FIG. 18 shows a plan view illustrating a conventional NFET 302 and PFET 300. FIG. 18 also shows gate cut openings 320NN and 320PP that isolate adjacent NFETs (upper end of view) and adjacent PFETs, respectively (lower end of view) (FETs not shown). Where a gate cut isolation is desired between certain parts of PFET 300 and NFET 302, a gate cut landing area 322, i.e., space between PFET 300 and NFET 302, may not provide sufficient width to land a gate cut isolation using current processes. In order to address this situation, as shown in the middle of FIG. 18, current practice is to reduce the width of active nanostructures 320N, 320P and the respective NFET 302 and PFET 300, where necessary, to enlarge the spacing therebetween and create a larger gate cut isolation landing area 324. Here, a gate cut isolation opening 320NP can be created in area 324. Unfortunately, as shown, this process requires formation of tapered NFET 302 and PFET 300 devices (e.g., with jogs and corners) that are hard to manufacture due to, e.g., nanostructure variability, proximity issues, lithography and patterning limits, etc. Further, the reduction in size of the FETs is typically accompanied by a reduction in performance of the FETs.

In contrast, as shown in FIG. 17, isolation pillar 160 coupled with isolation region 208 can create a gate cut isolation 212 between NFET 200 and PFET 202 without the need to enlarge the spacing therebetween, eliminating the complexity and performance impact due to the tapered NFET 302 and PFET 300. That is, isolation pillar 160 is used as part of gate cut isolation 212, and because it is built in-place in the smaller gate cut landing area, e.g., 322 (FIG. 18), it does not require adjusting nanostructures 120N, 120P. Further, as observed in FIG. 17, isolation region 208 can be wider than isolation pillar 160, allowing use of conventional or even relaxed gate cut isolation masks, etc., to be employed in layers above NFET 200 and PFET 202. Isolation region 208 can also extend laterally over NFET 200 and/or PFET 202 because isolation region 208 only needs to extend to isolation pillar 160, not between the FETs. Hence, the precision at which isolation region 208 must be formed is relaxed because isolation region 208 only needs to contact isolation pillar 160 to form gate cut isolation 212, i.e., space 322 (FIG. 18) does not have to be enlarged to allow it to land between NFET 200 and PFET 202. A lower end of isolation region 208 is a relatively large distance above active nano structures 120P, 120N since upper end of isolation pillar 210 is a relatively large distance above the active nanostructures. In FIG. 17, a gate cut opening 250 can be formed, e.g., using a mask, at a number of different points in the process. For example, gate cut opening 250 may be made prior to dummy gate 150 removal (FIG. 3), or it may be made after second WFM 196 and optional gate metal layer 204 formation, i.e., etching gate metal layer 204 and second WFM 196 until an upper portion of isolation pillar 160 is reached. In any event, gate cut opening 250 reaches the upper portion of isolation pillar 160, and is filled with a dielectric such as SiN to form isolation region 208 and gate cut isolation 212. While isolation region 208 is shown formed through gate metal layer 204, it is understood that isolation region 208 is also applicable to embodiments that do not employ gate metal layer 204. It is noted that the teachings of the disclosure relative to gate cut isolation 212 are applicable to form a gate cut isolation 212 between any two FETs, not just an NFET and a PFET.

Referring to FIGS. 16 and 17, a field effect transistor (FET) structure 240 according to embodiments of the disclosure may include: a first type FET, e.g., NFET 200, having active nanostructure 120N on substrate 112, a gate 242 having high-K layer 172 and (second) WFM 196 surrounding active nanostructure 120N and a source/drain (S/D) region 154N (FIG. 5) at each of opposing ends of active nanostructure 120N. FET structure 240 may also include PFET 202 having active nanostructure 120P on substrate 112 adjacent to active nanostructure 120N and separated by space 244. PFET 202 may include a gate 246 having high-K layer 172, first WFM 170 and second WFM 196 surrounding active nanostructure 120P, and a source/drain (S/D) region 154P (FIG. 5) at each of opposing ends of active nanostructure 120P. WFM 196 is different than WFM 170 to provide the desired WFM for each FET. In FET structure 240, isolation pillar 160 is positioned between active nanostructures 120N, 120P in space 244. As shown in FIG. 16, in one embodiment, one of WFMs 170, 196, i.e., the WFM for the first formed FET, extends along a sidewall (e.g., WFM 170 on sidewall 182R as illustrated) of isolation pillar 160 but not over part 176 thereof. In the description, WFM 170 (and high-K layer 172) for PFET 202 extends only along a sidewall 182R of isolation pillar 160 and not across or over part 176 thereof, i.e., because PFET 202 is formed first. It is appreciated that if NFET 200 was formed first, WFM 196 would extend along sidewall 182L and not across or over part 176 of isolation pillar 160. As shown in FIG. 16, the other one of WFMs (second WFM 196), extends over isolation pillar 160 including part 176 thereof to electrically connect gates 244, 246 of NFET 200 and PFET 202 together. That is, the second formed WFM, e.g., here WFM 196, may extend over part 176 of isolation pillar 160 to electrically connect NFET 200 and PFET 202.

FET structures 240 may also optionally include a gate metal layer 204, e.g., W or Co, over both WFMs 170, 196 to (further) electrically connect NFET 200 and PFET 202 together. In one embodiment, shown in FIG. 17, FET structure 240 may also include isolation region 208 extending to upper portion 210 of isolation pillar 160. Here, isolation region 208 and isolation pillar 160 create gate cut isolation 212 between NFET 200 and PFET 202 in space 244. As described herein, isolation region 208 may be wider than isolation pillar 160, i.e., it may extend laterally over NFET 200 and/or PFET 202.

As shown in FIG. 5, FET structure 240 may also include a portion of isolation pillar 160S positioned between adjacent S/D regions 154 of NFET 200 and PFET 202. In one embodiment, shown in FIG. 5, portion of isolation pillar 160S may be shorter than the rest of isolation pillar 160, i.e., as formed during or after dummy gate 150 (FIG. 3) patterning. FET structure 240, as shown in FIG. 6, may also be devoid of isolation pillar 160S.

As noted, in one embodiment, each of active nanostructures 120N, 120P may include a nanosheet stack 122 such that each WFM 170, 196 surrounds respective nanosheets 126. As will be appreciated by those with skill in the art, the teachings of the disclosure are equally applicable to other forms of active nanostructures, e.g., fins, nanowires, etc. Further, while the teachings of the disclosure are described relative to an isolation pillar 160 between an NFET and PFET, i.e., for N-P space, isolation pillar 160 may also be formed in spaces between same types of FETS, i.e., in N-N space and P-P space.

Embodiments of the disclosure enable robust first gate, e.g., PFET gate 246, formation for gate-all-around active nanostructures at scaled N-to-P spaces, e.g., at 7 nm technology node, required for the later formed second gate, e.g., NFET gate 242. The teachings of the disclosure also improves integration robustness by relaxing requirements on selected lithographic steps such as: edge placement of removal mask 190 (FIG. 14) for first WFM 170, and gate cut isolation 212 opening formation. With regard to gate cut isolation 212 formation, the disclosure enables gate cut openings (with gates or using replacement metal gate (RMG) processing) with relaxed lithographic requirements, and eliminates the need to form tapered devices, e.g., with jogs or corners in the devices. Advantageously, embodiments of the disclosure also do not require additional materials.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A field effect transistor (FET) structure, comprising:
 a first type field effect transistor having: a first active nanostructure on a substrate, a gate having a high dielectric constant (high-K) layer and a first work function metal (WFM) surrounding the first active nanostructure, and a source/drain (S/D) region at each of opposing ends of the first active nanostructure;
 a second type field effect transistor having: a second active nanostructure on the substrate adjacent to the first active nanostructure and separated by a space, the second FET further including a gate having the first WFM and a second work function metal (WFM) surrounding the second active nanostructure, and a source/drain (S/D) region at each of opposing ends of the second active nanostructure, the second WFM being different than the first WFM; and
 an isolation pillar positioned between the first and second active nanostructures in the space,
 wherein one of the first and second WFMs extends along a sidewall of the isolation pillar but not over a part of the isolation pillar.

2. The FET structure of claim 1, wherein the other one of the first and second WFMs extends over the isolation pillar including the part thereof to electrically connect the gates of the first FET and the second FET together.

3. The FET structure of claim 2, further comprising a gate metal layer over the first and the second WFMs to electrically connect the gates of the first FET and the second FET together.

4. The FET structure of claim 3, further comprising an isolation region extending to an upper portion of the isolation pillar, wherein the isolation region and the isolation pillar create a gate cut isolation between the first FET and the second FET in the space, wherein the isolation region is wider than the isolation pillar.

5. The FET structure of claim 1, wherein the isolation pillar is also positioned between adjacent S/D regions of the NFET and the PFET,
 wherein the isolation pillar is shorter between the S/D regions than between the first and second active nanostructures.

6. The FET structure of claim 1, wherein each of the first and second active nanostructures includes a nanosheet stack.

* * * * *